US008889224B2

(12) United States Patent
Chang et al.

(10) Patent No.: US 8,889,224 B2
(45) Date of Patent: Nov. 18, 2014

(54) METHOD OF FORMING PARYLENE FILM

(75) Inventors: Chun-Hao Chang, Kaohsiung County (TW); Chuan-Sheng Zhuang, Taichung County (TW)

(73) Assignee: Industrial Technology Research institute, Hsinchu (TW)

( * ) Notice: Subject to any disclaimer, the term of this patent is extended or adjusted under 35 U.S.C. 154(b) by 938 days.

(21) Appl. No.: 12/876,226

(22) Filed: Sep. 6, 2010

(65) Prior Publication Data

US 2011/0151121 A1 Jun. 23, 2011

(30) Foreign Application Priority Data

Dec. 18, 2009 (TW) .............................. 98143702 A

(51) Int. Cl.
| | |
|---|---|
| C23C 16/26 | (2006.01) |
| C23C 16/44 | (2006.01) |
| C23C 16/452 | (2006.01) |
| B05D 1/00 | (2006.01) |

(52) U.S. Cl.
CPC ............... *C23C 16/452* (2013.01); *B05D 1/60* (2013.01)
USPC ..................................... 427/249.1; 427/255.5

(58) Field of Classification Search
USPC ........................................... 427/249.1, 255.5
See application file for complete search history.

(56) References Cited

U.S. PATENT DOCUMENTS

| | | | | |
|---|---|---|---|---|
| 4,945,856 A | * | 8/1990 | Stewart ......................... | 118/715 |
| 5,078,091 A | | 1/1992 | Stewart | |
| 5,312,489 A | * | 5/1994 | Olson ........................... | 118/719 |
| 5,882,725 A | * | 3/1999 | Radford ........................ | 427/212 |
| 2003/0083646 A1 | * | 5/2003 | Sirhan et al. ............... | 604/891.1 |
| 2005/0000435 A1 | | 1/2005 | Lee et al. | |
| 2006/0007983 A1 | * | 1/2006 | Tai et al. ....................... | 374/121 |
| 2006/0018360 A1 | * | 1/2006 | Tai et al. ....................... | 374/121 |
| 2009/0017295 A1 | * | 1/2009 | Liu et al. ...................... | 428/339 |
| 2009/0133622 A1 | * | 5/2009 | Huang et al. ................. | 118/663 |

(Continued)

FOREIGN PATENT DOCUMENTS

| | | |
|---|---|---|
| CN | 1597137 | 3/2005 |
| CN | 101438387 | 5/2009 |
| CN | 101469415 | 7/2009 |

OTHER PUBLICATIONS

Fortin, J.B., et al., "A Model for the Chemical Vapor Deposition of Poly(para-xylylene) (Parylene) Thin Films". Chem. Mater. 2002, 14, 1945-1949.*

(Continued)

*Primary Examiner* — Bret Chen
(74) *Attorney, Agent, or Firm* — Jianq Chyun IP Office

(57) ABSTRACT

A method for forming a parylene film is provided, which includes following steps. Providing a chemical vapor deposition apparatus including a buffer chamber having first and second valves and a rotative carrying apparatus, an evaporator connected with the second valve, a pyrolysis chamber connected with the evaporator, and a deposition chamber connected with the pyrolysis chamber. Placing a parylene material in the rotative carrying apparatus of the buffer chamber through the first valve. Turning off the first and second valves and balancing a pressure in the buffer chamber and a pressure in the evaporator. Turning on the second valve and delivering the parylene material into the evaporator. Evaporating the parylene material in the evaporator to form a parylene gas. Pyrolyzing the parylene gas in the pyrolysis chamber to form a parylene monomer. Delivering the parylene monomer to the deposition chamber for deposition so as to form a parylene film.

7 Claims, 3 Drawing Sheets

(56) References Cited

U.S. PATENT DOCUMENTS

| | | | | |
|---|---|---|---|---|
| 2009/0263581 | A1* | 10/2009 | Martin et al. | 427/255.395 |
| 2009/0263641 | A1* | 10/2009 | Martin et al. | 428/221 |
| 2010/0119839 | A1* | 5/2010 | Chen | 428/422 |
| 2011/0151121 | A1* | 6/2011 | Chang et al. | 427/255.6 |
| 2012/0145215 | A1* | 6/2012 | Hwang et al. | 136/232 |
| 2012/0235961 | A1* | 9/2012 | Yang et al. | 345/204 |
| 2013/0089667 | A1* | 4/2013 | Lai et al. | 427/255.28 |

OTHER PUBLICATIONS

Vaeth, Kathleen M., et al., "Transition Metals for Selective Chemical Vapor Deposition of Parylene-Based Polymers". Chem. Mater. 2000, 12, 1305-1313.*

Takagi, Dai, et al., "Pyrolyzed Parylene Structure as Selective Emitter for High-Efficiency Thermophotovoltaic Power Generation". Proc. IEEE Int. Conf. MEMS 2007, Kobe, (2007), pp. 883-886.*

"Second Office Action of China Counterpart Application", issued on Dec. 4, 2012, p. 1-p. 9, in which the listed references were cited.

* cited by examiner

METHOD OF FORMING PARYLENE FILM

CROSS-REFERENCE TO RELATED APPLICATION

This application claims the priority benefit of Taiwan application serial no. 98143702, filed on Dec. 18, 2009. The entirety of the above-mentioned patent application is hereby incorporated by reference herein and made a part of this specification.

BACKGROUND OF THE INVENTION

1. Field of the Invention

The invention relates to a deposition apparatus and a method of forming a film. More particularly, the invention relates to a chemical vapor deposition apparatus and a method of forming a parylene film.

2. Description of Related Art

Parylene film has superior water resistance and oxygen resistance, high transparency and insulation, and capability in preventing rust, corrosion, and efflorescence. Thus, parylene film is usually adopted as the gas barrier layer on the surface of the flexible plastic substrate in current flexible displays.

In conventional fabrication, a parylene film is generally formed by a chemical vapor deposition (CVD) method. Firstly, powdered parylene is placed in an evaporator and heated to 150° C. for evaporating powdered parylene. Parylene gas is then passed to a pyrolysis chamber and heated to 650° C. for pyrolysis. Next, parylene monomer is delivered to a deposition chamber and deposited on a substrate.

Generally, in a CVD apparatus for performing the aforementioned CVD method, throttle valves are disposed respectively between the evaporator and the pyrolysis chamber and between the pyrolysis chamber and the deposition chamber for adjusting the pressure in the CVD apparatus and for controlling the flow of parylene through the throttle valves for adjusting the thickness of the parylene film deposited on the substrate. However, the evaporated parylene gas easily deposits in an environment under 150° C. Accordingly, the parylene film is usually formed on the throttle valves, and this leads to damages of the throttle valves and requires costly replacement fees. In addition, when powdered raw material is replaced with aqueous raw material to overcome the above problem, the fabrication cost significantly increases as the price of aqueous raw material is about 100 times of that of powdered raw material.

Other than the foregoing CVD apparatus, another CVD apparatus for forming the parylene film is introduced. In this CVD apparatus, throttle valves are not disposed between the evaporator and the pyrolysis chamber and between the pyrolysis chamber and the deposition chamber. In other words, the evaporator, the pyrolysis chamber, and the deposition chamber are connected to one another, and the damages of the throttle valves can therefore be avoided. Nevertheless, in the process of forming the parylene film with this CVD apparatus, when the parylene material has been consumed, the apparatus needs to be stopped to refill the parylene powder and cool the temperature therefore to room temperature, thereby failing to fabricate continuously.

SUMMARY OF THE INVENTION

The invention is directed to a chemical vapor deposition (CVD) apparatus capable of fabricating continuously.

The invention is further directed to a method of forming a parylene film capable of refilling a parylene material when continuously fabricating the parylene film.

The invention is directed to a CVD apparatus including a buffer chamber, an evaporator, a pyrolysis chamber, and a deposition chamber. The buffer chamber has a first valve and a second valve. The evaporator is connected with the second valve. The pyrolysis chamber is connected with the evaporator through a first pipe, where the first pipe has a third valve. The deposition chamber is connected with the pyrolysis chamber.

The invention is further directed to a method of forming a parylene film and the method involves providing a CVD apparatus. The CVD apparatus includes a buffer chamber, an evaporator, a pyrolysis chamber, and a deposition chamber. The buffer chamber has a first valve and a second valve. The evaporator is connected with the second valve. The pyrolysis chamber is connected with the evaporator through a first pipe, where the first pipe has a third valve. The deposition chamber is connected with the pyrolysis chamber. A parylene material is placed in the buffer chamber through the first valve. The first valve and the second valve are turned off and the pressure in the buffer chamber and the pressure in the evaporator are balanced. The second valve is turned on and the parylene material is delivered into the evaporator. The parylene material is evaporated in the evaporator to form a parylene gas. The third valve is turned on for passing the parylene gas into the pyrolysis chamber through the first pipe. The parylene gas is pyrolyzed in the pyrolysis chamber to form a parylene monomer. The parylene monomer is delivered to the deposition chamber for deposition so as to form a parylene film.

Accordingly, in the invention, the buffer chamber is disposed in front of the evaporator; thus when refilling the parylene material during the fabrication, the refilling step can be performed by turning off the valve between the buffer chamber and the evaporator and delivering the parylene material to the buffer chamber. Moreover, the stopping of the CVD apparatus or the discontinuation of the fabrication caused by releasing vacuum can be prevented by refilling the parylene material with the foregoing method. Consequently, the parylene film can be fabricated continuously.

In order to make the aforementioned and other features of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
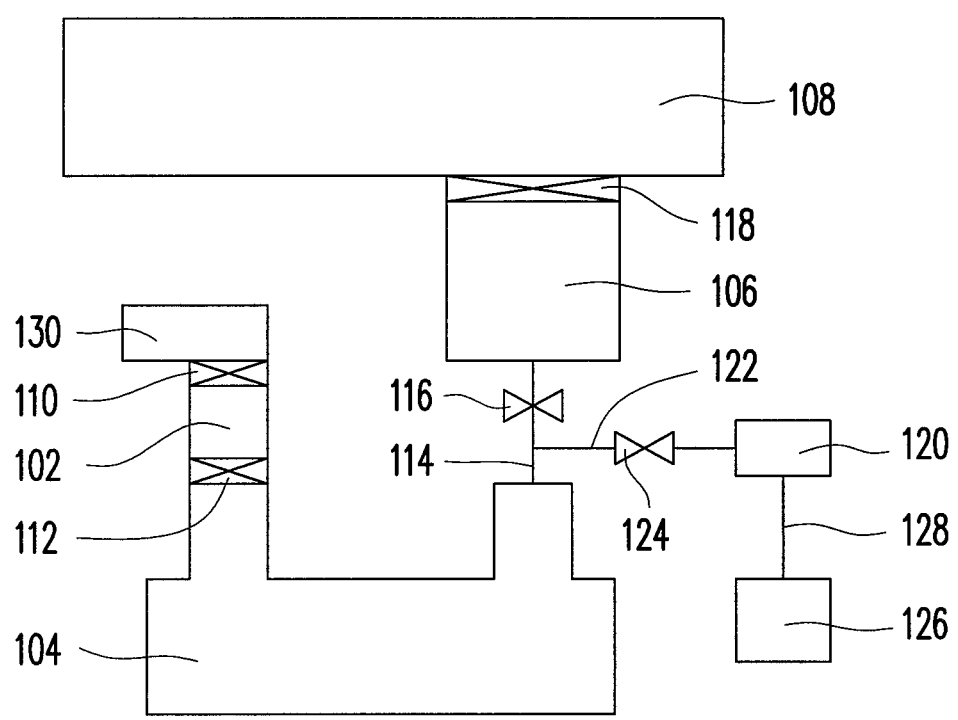
FIG. 1 is a schematic view of a chemical vapor deposition (CVD) apparatus according to one embodiment of the invention.

FIG. 1 is a schematic view of a chemical vapor deposition (CVD) apparatus according to one embodiment of the invention. Referring to FIG. 1, a CVD apparatus 100 includes a buffer chamber 102, an evaporator 104, a pyrolysis chamber 106, and a deposition chamber 108. The buffer chamber 102 has a first valve 110 and a second valve 112. The first valve 110 is, for example, a gate valve configured to connect or disconnect the buffer chamber 102 and the external environment. The second valve 112 is, for example, a gate valve configured to connect or disconnect the buffer chamber 102 and the evaporator 104. The evaporator 104 is connected with the second valve 112. The evaporator 104 evaporates the material to form a reactive gas adopted in the CVD process. The pyrolysis chamber 106 is connected with the evaporator 104 through a first pipe 114, where the first pipe 114 has a third valve 116. The pyrolysis chamber 106 is configured to perform a pyrolysis to the reactive gas in the CVD process. The third valve 116 is, for example, an air actuated valve configured to control whether or not to pass the reactive gas generated in the evaporator 104 to the pyrolysis chamber 106. The deposition chamber 108 is connected with the pyrolysis chamber 106. In the present embodiment, the deposition chamber 108 has a fourth valve 118 and the pyrolysis chamber 106 is connected with the deposition chamber 108 through the fourth valve 118. The deposition chamber 108 is configured to perform a CVD so as to form a film on a substrate to be deposited in the deposition chamber 108. The fourth valve 118 is, for example, a gate valve configured to connect or disconnect the deposition chamber 108 and the pyrolysis chamber 106.

Moreover, the CVD apparatus 100 further includes a cold trap 120. The cold trap 120 is connected with the evaporator 104 through a second pipe 122, where the second pipe 122 has a fifth valve 124. The cold trap 120 traps the reactive gas which is in an unstable evaporated state within the evaporator 104. The unstable evaporated state is a state where features such as an evaporation rate, a composition of the generated gas and so on are unstable. The fifth valve 124 is, for example, an air actuated valve configured to control whether or not to pass the reactive gas generated in the evaporator 104 to the cold trap 120.

Additionally, the CVD apparatus 100 further includes a pump 126. The pump 126 is connected with the cold trap 120 through a third pipe 128. The pump 126 evacuates the gas passed to the cold trap 120.

The CVD apparatus 100 further includes a sorter 130. The sorter 130 is connected with the buffer chamber 102 through the first valve 110. The sorter 130 precisely sorts the material in the external environment and delivers the sorted material into the buffer chamber 102 through the first valve 110.

Obviously, depending on actual requirements, the CVD apparatus 100 can also include other conventional apparatuses that are not illustrated herein, for example, mass flow controllers, throttle valves, and so on. The mass flow controllers are configured to pass the reactive gas generated in the evaporator 104 to the pyrolysis chamber 106 quantitatively. The throttle valves controls the pressure within the deposition chamber 108.

The buffer chamber 102 and the evaporator 104 are further illustrated below.

Figure 2:
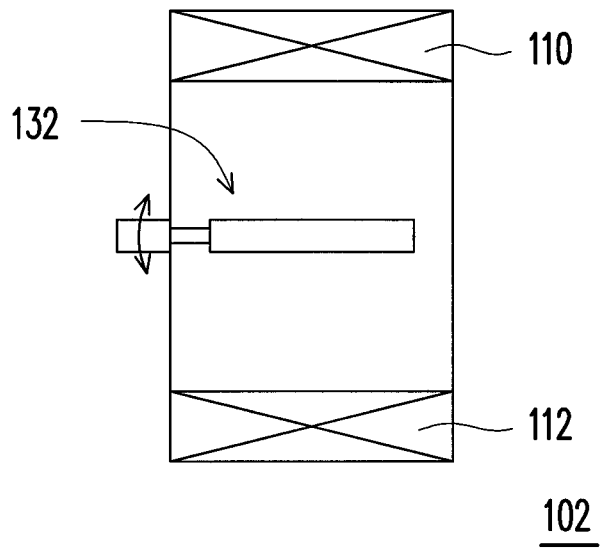
FIG. 2 is a schematic cross-sectional view of a buffer chamber in a CVD apparatus according to one embodiment of the invention.

FIG. 2 is a schematic cross-sectional view illustrating the buffer chamber 102 according to one embodiment of the invention. Referring to FIG. 2, the buffer chamber 102 has the first valve 110 and the second valve 112. The buffer chamber 102 has a carrying apparatus 132. In the present embodiment, the carrying apparatus 132 is a rotative carrying apparatus. When the material is delivered to the buffer chamber 102 through the first valve 110, the material is first placed on the carrying apparatus 132. After the second valve 112 is turned on, the carrying apparatus 132 is rotated, so that the material is passed through the second valve 112 and delivered to the evaporator 104. In other embodiments, carrying apparatuses of other types can also be utilized, and the invention is not limited thereto.

Figure 3:
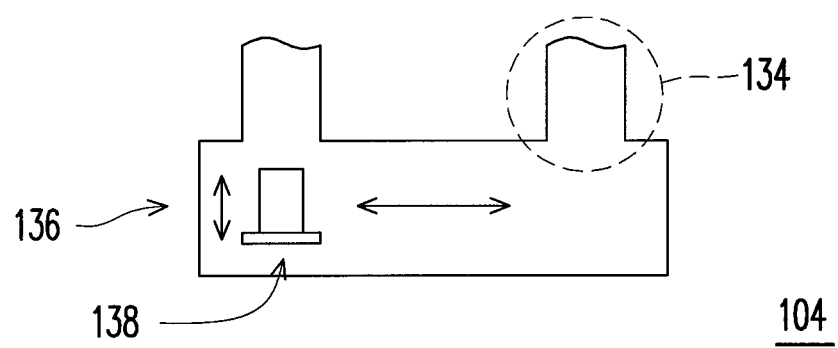
FIG. 3 is a schematic cross-sectional view of an evaporator in a CVD apparatus according to one embodiment of the invention.

FIG. 3 is a schematic cross-sectional view illustrating the evaporator 104 according to one embodiment of the invention. Referring to FIG. 3, the evaporator 104 includes an evaporation region 134 and a material receiving region 136. A material receiving apparatus 138 is disposed movably in the evaporator 104. Specifically, the material receiving apparatus 138 moves in the evaporation region 134 and the material receiving region 136. In the present embodiment, the material receiving apparatus 138 moves both in vertical and in horizontal directions (as shown by arrows) in the evaporator 104. When the material is delivered from the buffer chamber 102 to the evaporator 104, the material receiving apparatus 138 first moves to a location close to the second valve 112 in the material receiving region 138 to receive the material, and then moves to the evaporation region 134 to evaporate the material. In other words, the material receiving region 136 is configured to receive the material, the material receiving apparatus 138 sends the material to the evaporation region 134, and the evaporation region 134 is configured to heat the material to form a reactive gas in an evaporated state. In other embodiments, the material receiving apparatus can move in other manners depending on the design of the evaporator 104, and the invention is not limited thereto.

It should be noted that in the embodiment illustrated in FIG. 1, the buffer chamber 102 is located above the evaporator 104; however, in other embodiments, the buffer chamber 102 can be located on a side of the evaporator 104 depending on actual requirements.

In the CVD apparatus 100, since the buffer chamber 102 is disposed in front of the evaporator 104, when the material in the buffer chamber 102 is all delivered to the evaporator 104 or when the material needs to be further refilled in the CVD process, the refilling step can be performed by turning off the second valve 112 and delivering the material into the buffer chamber 102 through the first valve 110 without stopping the CVD apparatus 100 or releasing vacuum in the evaporator 104. As a consequence, the continuous fabrication can be achieved.

In the following, a flowchart illustrating steps of forming a parylene film by using the CVD apparatus 100 is described.

Figure 4:
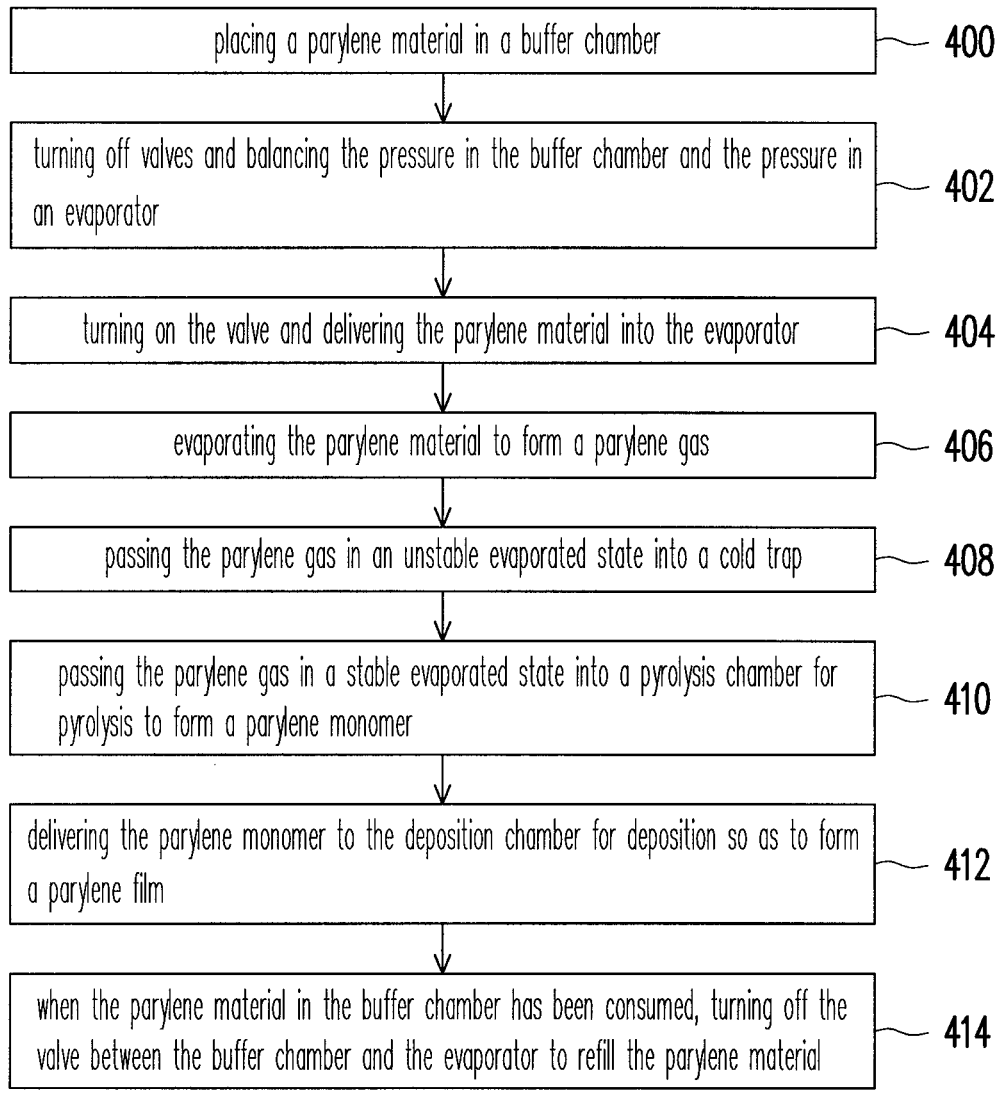
FIG. 4 is a flowchart illustrating a formation of a parylene film by using a CVD apparatus of the invention.

FIG. 4 is a flowchart illustrating a formation of a parylene film by using the CVD apparatus 100. Referring to FIGS. 1, 2, 3, and 4, the parylene material is placed in the buffer chamber 102 in step 400. The parylene material is, for example, in powder form. The parylene material is placed in the buffer chamber 102 by, for example, precisely sorting the parylene material with the sorter 130 and placing the material in the carrying apparatus 132 in the buffer chamber 102 through the first valve 110.

In step 402, the first valve 110 and the second valve 112 are turned off and the pressure in the buffer chamber 102 and the pressure in the evaporator 104 are balanced. The pressure in the buffer chamber 102 and the pressure in the evaporator 104 are balanced by, for example, performing a vacuuming step, such that the buffer chamber 102 and the evaporator 104 attain the same negative pressure.

In step 404, when the pressure of the buffer chamber 102 and the pressure of the evaporator 104 are balanced, the second valve 112 is turned on to deliver the parylene material into the evaporator 104. The parylene material is delivered into the evaporator 104 by, for example, rotating the carrying apparatus 132 in the buffer chamber 102 to deliver the parylene material into the material receiving apparatus 138 located in the material receiving region 136 of the evaporator 104.

In step 406, the material receiving apparatus 138 is moved from the material receiving region 136 to the evaporation region 134 to evaporate the parylene material so as to generate the parylene gas.

In step 408, when the parylene gas is in an unstable evaporated state, the parylene gas is passed to the cold trap 120 through the second pipe 122. The unstable evaporated state is a state where features such as an evaporation rate, a composition of the generated gas and so on are unstable. In the evaporating process, since a temperature of the evaporator 104 is raised from room temperature to an evaporating temperature of parylene (about 150° C.), the parylene gas generated in the beginning of the evaporation is an unstable evaporated state. Therefore, the quality of the parylene film formed can be effectively enhanced by passing the parylene gas, which is in an unstable evaporated state, to the cold trap 120. During the fabrication, the pump 126 evacuates the parylene gas passed to the cold trap 120.

In step 410, after the parylene gas is in a stable evaporated state, the fifth valve 124 is turned off and the third valve 116 is turned on, and the parylene gas is passed to the pyrolysis chamber 106 through the first pipe 114 so as to pyrolyze the parylene gas in the pyrolysis chamber 106 for forming the parylene monomer.

In step 412, the fourth valve 118 is turned on to deliver the parylene monomer to the deposition chamber 108 for deposition so as to form the parylene film.

In step 414, when the parylene material in the buffer chamber 102 has been consumed, the second valve 112 is turned off and the first valve 110 is turned on to refill the parylene material. Step 400 through step 412 are repeated until the parylene film of the required thickness is formed.

In the present embodiment, the refill of the parylene material during the fabrication can be performed by turning off the second valve 112 between the buffer chamber 102 and the evaporator 104 and delivering the parylene material into the buffer chamber 102. As a consequence, the step of refilling the parylene material can be performed without stopping the CVD apparatus 100 or releasing vacuum in the evaporator 104. The fabrication of the parylene film can thus be performed continuously.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of forming a parylene film, comprising:
   providing a chemical vapor deposition apparatus, comprising:
   a buffer chamber, having a first valve, a second valve, and a rotative carrying apparatus;
   an evaporator, connected with the second valve;
   a pyrolysis chamber, connected with the evaporator through a first pipe, wherein the first pipe has a third valve; and
   a deposition chamber, connected with the pyrolysis chamber;
   placing a parylene material in the rotative carrying apparatus of the buffer chamber through the first valve, wherein the parylene material is in a powder form;
   turning off the first valve and the second valve and balancing a pressure in the buffer chamber and a pressure in the evaporator;
   turning on the second valve and delivering the parylene material into the evaporator by the rotative carrying apparatus;
   evaporating the parylene material in the evaporator to form a parylene gas;
   turning on the third valve for passing the parylene gas into the pyrolysis chamber through the first pipe;
   pyrolyzing the parylene gas in the pyrolysis chamber to form a parylene monomer; and
   delivering the parylene monomer to the deposition chamber for deposition so as to form a parylene film, wherein after the parylene material in the buffer chamber is consumed, a refill of the parylene material is performed by turning off the second valve, turning on the first valve and delivering the parylene material the into the buffer chamber without stopping the chemical vapor deposition apparatus.

2. The method of forming the parylene film as claimed in claim 1, wherein the evaporator has a material receiving region and an evaporation region, and a material receiving apparatus is movably disposed in the evaporator, and when the parylene material is delivered to the evaporator, the material receiving apparatus receives the parylene material at the material receiving region and delivers the parylene material to the evaporator.

3. The method of forming the parylene film as claimed in claim 1, wherein the chemical vapor deposition apparatus further comprises a sorter and the sorter is connected with the buffer chamber through the first valve, so as to place the parylene material in the buffer chamber through the first valve.

4. The method of forming the parylene film as claimed in claim 1, wherein the deposition chamber has a fourth valve, the pyrolysis chamber is connected with the deposition chamber through the fourth valve, the parylene monomer is delivered to the deposition chamber through the fourth valve for deposition so as to form the parylene film.

5. The method of forming the parylene film as claimed in claim 1, wherein the chemical vapor deposition apparatus further comprises a cold trap connected with the evaporator through a second pipe having a fifth valve, and, after forming the parylene gas and before turning on the third valve, the parylene gas in an unstable evaporated state is passed to the cold trap through the second pipe.

6. The method of forming the parylene film as claimed in claim 5, wherein after the parylene gas is in a stable evaporated state, the fifth valve is turned off and the third valve is turned on.

7. The method of forming the parylene film as claimed in claim 5, wherein the chemical vapor deposition apparatus further comprises a pump configured to evacuate the parylene gas passed to the cold trap.

* * * * *